United States Patent

Pankove et al.

[11] 4,392,011
[45] Jul. 5, 1983

[54] SOLAR CELL STRUCTURE INCORPORATING A NOVEL SINGLE CRYSTAL SILICON MATERIAL

[75] Inventors: Jacques I. Pankove, Princeton; Chung P. Wu, Trenton, both of N.J.

[73] Assignee: RCA Corporation, New York, N.Y.

[21] Appl. No.: 309,695

[22] Filed: Oct. 8, 1981

Related U.S. Application Data

[62] Division of Ser. No. 145,239, Apr. 30, 1980, Pat. No. 4,322,253.

[51] Int. Cl.³ .............................................. H01L 31/06
[52] U.S. Cl. .............................. 136/261; 252/62.3 E; 357/30; 357/63; 428/641
[58] Field of Search ................... 252/62.3 E; 428/620, 428/641; 136/261; 357/30, 63; 148/1.5

[56] References Cited

U.S. PATENT DOCUMENTS 4,113,514  9/1978  Pankove et al. ................. 148/1.5

*Primary Examiner*—Aaron Weisstuch
*Attorney, Agent, or Firm*—Birgit E. Morris; Donald S. Cohen

[57] ABSTRACT

A novel hydrogen rich single crystal silicon material having a band gap energy greater than 1.1 eV can be fabricated by forming an amorphous region of graded crystallinity in a body of single crystalline silicon and thereafter contacting the region with atomic hydrogen followed by pulsed laser annealing at a sufficient power and for a sufficient duration to recrystallize the region into single crystal silicon without out-gassing the hydrogen. The new material can be used to fabricate semiconductor devices such as single crystal silicon solar cells with surface window regions having a greater band gap energy than that of single crystal silicon without hydrogen.

5 Claims, 2 Drawing Figures

SOLAR CELL STRUCTURE INCORPORATING A NOVEL SINGLE CRYSTAL SILICON MATERIAL

The Government of the United States of America has rights in this invention pursuant to contract AC03-78ET21074 awarded by the Department of Energy.

This is a division of application Ser. No. 145,239, filed Apr. 30, 1980, now U.S. Pat. No. 4,322,253.

This invention relates to single crystal semiconductor devices. More specifically, this invention relates to semiconductor devices such as single crystal silicon solar cells.

BACKGROUND OF THE INVENTION

The operating performance of a semiconductor device having active components disposed therein is frequently degraded by dangling bonds which occur primarily at the surface of the device or at vacancies, micropores, dislocations, and the like which are incorporated into the device. The dangling bonds are responsible for states in the energy gap which affect the level of surface recombination. In addition, the performance of a silicon solar cell is often degraded by the highly doped surface region which causes recombinations of some of the electrons and holes, thus preventing the electrons generated by the solar photons from being collected by the elecrtrodes of the solar cell.

Hydrogenated amorphous silicon fabricated by a glow-discharge and devices fabricated therefrom are described in U.S. Pat. No. 4,064,521, incorporated herein by reference. Amorphous silicon, and specifically hydrogenated amorphous silicon fabricated by a glow-discharge, has a band gap energy which is greater than the band gap energy of crystalline silicon. Typically, hydrogenated amorphous silicon has a band gap energy of about 1.7 eV whereas crystalline silicon has a band gap energy of about 1.1 eV. The larger band gap energy of the material at the surface presents a barrier to the minority carriers and therefore reduces loss of the minority carriers through recombination processes at the surface. The glow-discharge produced hydrogenated amorphous silicon contains approximately 18 to 50 atomic percent of hydrogen, as has been shown by J. I. Pankove et al. in *Appl. Phys. Letters*, Vol. 31 (1977), pg. 450. The hydrogen passivates the dangling bonds in the silicon material. Heating the amorphous silicon in a vacuum causes the hydrogen to evolve, which causes a deterioration in the properties of the hydrogenated amorphous silicon. Thus the hydrogen has been shown to be an effective passivating element for amorphous silicon.

A method of passivating a semiconductor device is described in U.S. Pat. No. 4,113,514, issued Sept. 12, 1978 and incorporated by reference herein. The method comprises exposing the silicon semiconductor device to atomic hydrogen at a temperature lower than about 450°; subsequently, such a device must be kept below this dehydrogenation temperature, otherwise the hydrogen escapes the dangling bonds. The passivation technique can also be applied to crystalline silicon PN junction devices by applying a layer of hydrogenated amorphous silicon on the surface of the semiconductor device. However, upon heating, such layers of hydrogenated amorphous silicon can blister and flake off, thus exposing the crystalline silicon to the ambient environment.

U.S. Pat. No. 4,224,084 entitled *METHOD AND STRUCTURE FOR PASSIVATING A SEMICONDUCTOR DEVICE*, issued on Apr. 23, 1980, to J. I. Pankove and incorporated herein by reference, provides a technique for neutralizing the dangling bonds in a semiconductor device. The neutralization of the dangling bonds passivates the device and reduces the number of recombination-generation centers in the device. The technique provides for an adherent passivation which can withstand heating up to 700° C. The technique basically involves the amorphization of the surface of crystalline silicon followed by the exposure of the amorphized surface to atomic hydrogen, thereby creating a device of graded crystallinity with a large concentration of hydrogen at the surface of the device.

Although the region of graded crystallinity incorporating atomic hydrogen saturates the dangling bonds, the surface region is not single crystal silicon. It would be desirable to have a single crystal silicon material having a graded band gap due to the incorporation of atomic hydrogen therein, and a method of preparing same.

SUMMARY OF THE INVENTION

Our invention is a method of forming a single crystal silicon material having a region wherein the band gap energy is greater than the band gap energy of single crystal silicon material, through the incorporation of atomic hydrogen therein. The method involves amorphizing the surface of a body of single crystal silicon to a desired depth, exposing said body to atomic hydrogen, and irradiating said body with a pulsed laser beam of sufficient power and for sufficient duration to recrystallize the amorphized region of the body without dehydrogenation thereof. Single crystal silicon solar cells having a region incident to solar radiation with a window region of crystalline silicon having a band gap greater than 1.1 eV can be fabricated by our invention.

DETAILED DESCRIPTION OF THE INVENTION

Figure 1:
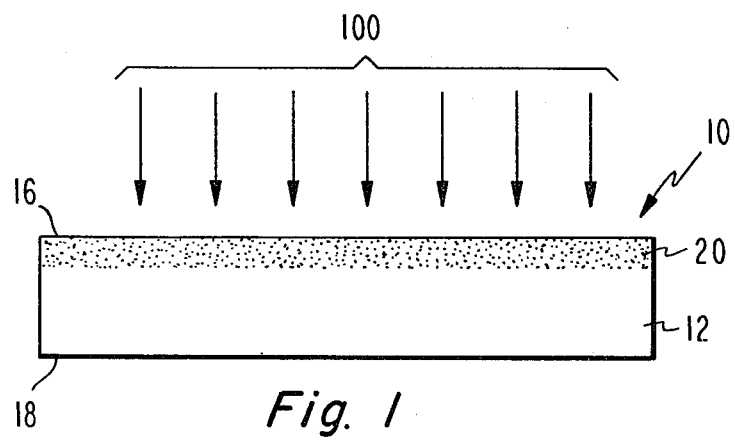
FIG. 1 is a cross-sectional view of a single crystal silicon device wherein the surface has been amorphized, treated with atomic hydrogen, and pulse laser annealed.

The invention will be more clearly illustrated and described by referring to the FIGURES. FIG. 1 illustrates a semiconductor device 10. The semiconductor device 10 has a body of single crystal silicon 12 with opposed major surfaces 16 and 18. The body 12 can be of one conductivity type or have regions of differing conductivity forming a rectifying photovoltaic junction (not shown) or other active component. An active component refers to an active element within the device 10 which exhibits transistance, i.e., a capability of controlling voltages or currents so as to produce gain or switching in a circuit, such as amplification or rectification. In other words, the semiconductor device 10 has an active component therein such as Schottky barrier, a PN junction diode, a transistor, etc.

A portion of the body 12 adjacent to the major surface 16 is fabricated into an amorphous region 20 by the bombardment of body 12 with particles having sufficient energy and concentration to convert a part of the body 12 into an amorphous region. The amorphous region 20 is of graded crystallinity. Region 20 can be formed for example by subjecting the body 12 at surface 16 to a concentration of ions of about $10^{15}$ ions/cm$^2$ or greater. Suitable ions are atoms of $Si^{28}$, P, B, As, and the like. The ions can be generated within a conventional ion implantation system (not shown) and may have an energy in the range of 10 to 300 keV. The greater the energy and the lighter the mass of the implanted ions, the greater the depth of the region 20 of graded crystallinity will be formed in the body 12. Typically, the region of graded crystallinity can vary from about 0.05 micrometer to about 1.0 micrometer depending upon the energy and the mass of the bombarding particles. The purpose of the bombarding particles is to convert the top part of the body 12 adjacent the surface 16 into an amorphous region 20 gradually increasing in crystallinity away from the surface 16. Although ion implantation is utilized in the present embodiment to create a region 20 of graded disorder, any other type of particle bombardment may be utilized, as for example an electron beam.

Thereafter, the amorphous region 20 is exposed to atomic hydrogen, whereby an integral layer of hydrogenated amorphous silicon is formed adjacent to the crystalline region of the body 12. In a preferred embodiment, the exposing step is performed by subjecting molecular beam hydrogen gas (H$_2$) to a glow-discharge within a chamber at a pressure below about 5 torr and at a temperature lower than about 450° C. The exposure to atomic hydrogen may last for a few minutes to several hours. For more detailed information on exposing of a device to atomic hydrogen, see U.S. Pat. No. 4,113,514. The amorphization of the surface and subsequent exposure to atomic hydrogen creates a hydrogenated region of graded crystallinity having a thickness of from about 0.05 to about 1.0 or more micrometer.

The exposure to atomic hydrogen neutralizes the effects of the dangling bonds existing in the semiconductor device by attaching a hydrogen atom to each dangling bond. The hydrogen atoms penetrate the amorphized layer 20 and tie the dangling bonds by bonding to a dangling orbital in each surface atom to form a hydride such as Si:H, Si:H$_2$, or Si:H$_3$, thereby inducing a wider energy gap into the region of graded crystallinity. The regions of graded crystallinity have from about 5 to about 50 atomic percent hydrogen.

Subsequent to the formation of the amorphous region of graded crystallinity 20 and exposure to atomic hydrogen, the body 12 is exposed at surface 16 to a pulsed laser annealing operation 100. The pulsed laser has sufficient power and shortness of duration to recrystallize region 20 without dehydrogenation of region 20. The laser pulse must be controlled so as to recrystallize the region without out-gassing the hydrogen. If the pulse duration is too short or its power is too low, then the region remains amorphous. If laser power is too high or the pulse duration is too long, then the surface 16 heats to a sufficient temperature for too long a duration, sufficient to out-gas the hydrogen. For example, a Q switched neodymium glass laser having a wavelength of about 1.06 micrometers and a pulse duration of about 25 nanoseconds with a power of from about 45 to about 60 megawatts per square centimeter and preferably 50 MW/cm$^2$ to 60 MW/cm$^2$ or the equivalent is sufficient to recrystallize the silicon without out-gassing the hydrogen. The power-time treatment corresponds to an energy density in the range of from about 1.13 to about 1.50 joules per square centimeter. The annealing treatment is sufficient to recrystallize region 20, thereby forming a single crystal body having a region adjacent to surface 16 with a band gap energy which is greater than the 1.1 eV band gap energy associated with single crystal silicon. Other lasers and power, time, energy combinations can be employed which are equivalent to the 45 and 60 MW/cm$^2$ pulse duration of 25 nanoseconds, in accordance with the teachings outlined by A. E. Bell, *RCA Review*, Vol. 40, September 1979, pgs. 295–338, and incorporated herein by reference. The band gap energy can vary from about greater than 1.1 eV to 1.7 eV for the surface region 20, depending upon the amount of hydrogen incorporated in a single crystalline lattice structure.

Figure 2:
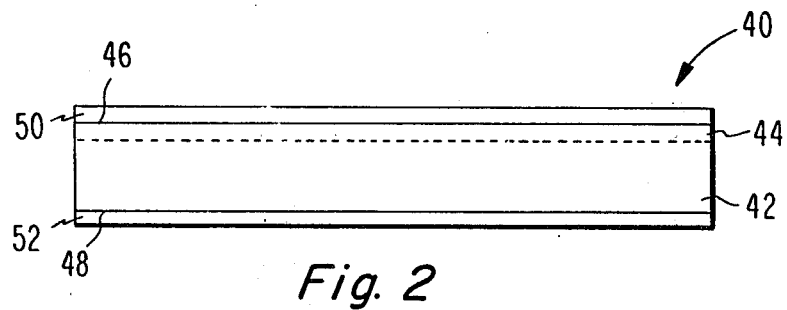
FIG. 2 is a cross-sectional view of a semiconductor device such as a single crystalline silicon solar cell incorporating the body of FIG. 1 treated in accordance with the method of the present invention.

FIG. 2 refers to a device 40, such as a solar cell, having a body 42 incorporating a rectifying junction and a region 44 of single crystal silicon having a band gap in excess of 1.1 eV through the incorporation of hydrogen therein. The body 40 has opposed major surfaces 46 and 48 having electrical contacts 50 and 52 ohmically contacting said surfaces respectively. Although not shown, the solar cell can also include other semiconductor layers, anti-reflection coatings, grid electrodes, and the like.

The advantage of this structure is that the absorption coefficient is enhanced in the hydrogen-rich region 44, especially at photon energies greater than about 1.7 eV. The photo-electrons are driven away from the surface by the high electric field resulting from the combined gradient of the chemical potential which occurs in all PN rectifying junctions and the gradual gap widening in the treated region due to the incorporation of hydrogen therein. A further advantage of this structure is that the surface recombination is reduced which in turn reduces the saturation current and increases the short-circuit photo-current. Furthermore, the wider gap surface acts as a window layer that transmits longer wavelengths solar radiation for absorption at and beyond the PN rectifying photovoltaic junction contained in body 42.

The invention will be more clearly illustrated by referring to the following example, but we do not intend to limit our invention to the details described therein. Other modifications which would be obvious to one skilled in the art are intended to be within the scope of the invention.

EXAMPLE

A standard N-type single crystal silicon wafer having a thickness of about 0.38 to 0.50 millimeter and a resistivity of about 10 $\mu$-cm was exposed to P+ having an energy of about 50 keV at a dosage of about $10^{16}$ atoms per square centimeter. The exposure to the P+ ions created an amorphous region of graded crystallinity to a depth of about 100 nanometers having a peak phosphorous concentration of about $10^{21}$ P-atoms/cm$^3$. Thereafter, the body and region of graded crystallinity was exposed to atomic hydrogen at a temperature of about 300° C. for about a half an hour. Finally, sections of the hydrogenated region of graded crystallinity were exposed to a Q switched neodymium glass laser for a duration of about 25 nanoseconds and powers of about 20, 30, 40, 50, 60, and 70 megawatts per square centimeter, MW/cm$^2$. The energy density varied from about 0.05 to about 1.75 joules per square centimeter, J/cm$^2$. The exposed sections were analyzed by electron diffraction. At 20, 30, and 40 MW/cm$^2$, the outer surface of the region of graded crystallinity remained amorphous. At 50, 60, and 70 MW/cm$^2$, the region was single crystal silicon. The laser treated regions were analyzed by secondary ion mass spectrometry, SIMS. The region pulsed at 50 and 60 MW/cm$^2$ that had become single crystalline contained hydrogen while the 70 MW/cm$^2$ region was depleted of the hydrogen due to the outgassing thereof during the pulsed laser annealing. The 50 MW/cm$^2$ treated section had the same concentration of hydrogen as the amorphous material; however, the material had been converted to single crystal material. The 60 MW/cm$^2$ treated section had nearly the same amounts of hydrogen and was also single crystal.

We claim:

1. A body of single crystal silicon material having a region incorporating hydrogen in a sufficient concentration to have a band gap energy in excess of 1.1 eV.

2. The body according to claim 1 wherein said region has a band gap energy between 1.1 eV and 1.7 eV.

3. The body according to claim 2 wherein said region is from about 0.05 to about 1.0 micrometer thick.

4. A single crystal silicon solar cell comprising:
   a body of single crystal silicon having regions of differing conductivity forming a photovoltaic junction therein, said body having opposed major surfaces wherein the major surface which is adapted to be incident to solar radiation has a region thereunder with sufficient concentration of hydrogen incorporated therein to have a band gap energy which is greater than the band gap energy of the single crystal silicon of said body; and
   means for electrically contacting said opposed major surfaces.

5. The single crystal solar cell according to claim 4 wherein said region has a band gap energy in excess of 1.1 eV and a thickness of from about 0.1 to about 1.0 micrometer.

* * * * *

UNITED STATES PATENT AND TRADEMARK OFFICE
CERTIFICATE OF CORRECTION

PATENT NO. : 4,392,011
DATED : July 5, 1983
INVENTOR(S) : Jacques Isaac Pankove

It is certified that error appears in the above-identified patent and that said Letters Patent is hereby corrected as shown below:

IN THE CLAIMS:

Claim 4, line 3: insert "rectifying" before "photovoltaic".

Signed and Sealed this

Twentieth Day of September 1983

[SEAL]

Attest:

GERALD J. MOSSINGHOFF

Attesting Officer

Commissioner of Patents and Trademarks